United States Patent [19]

Ward

[11] 4,321,565
[45] Mar. 23, 1982

[54] RELATIVE PHASE SENSOR EMPLOYING SURFACE ACOUSTIC WAVES

[75] Inventor: Robert B. Ward, Mountain View, Calif.

[73] Assignee: Lockheed Missiles & Space Co., Inc., Sunnyvale, Calif.

[21] Appl. No.: 170,026

[22] Filed: Jul. 18, 1980

[51] Int. Cl.³ .................... H03H 9/68; H03H 9/72
[52] U.S. Cl. ........................ 333/150; 324/83 R; 333/154
[58] Field of Search .................. 333/150–155, 333/193–196; 324/83 R; 331/107 A; 330/5.5; 310/313 R, 313 A, 313 B, 313 C, 313 D; 364/821–822

[56] References Cited

U.S. PATENT DOCUMENTS

| | | | |
|---|---|---|---|
| 3,723,916 | 3/1973 | Speiser et al. | 333/196 |
| 3,803,395 | 4/1974 | Quate | 310/313 R X |
| 4,070,638 | 1/1978 | Reeder | 333/150 |

Primary Examiner—Marvin L. Nussbaum
Attorney, Agent, or Firm—Thomas H. Olson; H. Donald Volk

[57] ABSTRACT

A sensor formed on the surface of a body of piezoelectric material. Two input transducers disposed on the surface in parallel spaced apart relation produce surface acoustic waves in the body in response to the application of signals to the input transducers. A row of output transducers is disposed on the surface between the input transducers. Individual output transducers are offset from one another by amounts related to the wavelength of the surface acoustic wave so that at or near only one of the output transducers will the two surface acoustic waves from the input transducers cancel each other. An analog circuit and a digital circuit for ascertaining which output transducer experiences maximum cancellation to afford a determination of the delay difference between the two signals applied to the input transducers.

7 Claims, 10 Drawing Figures

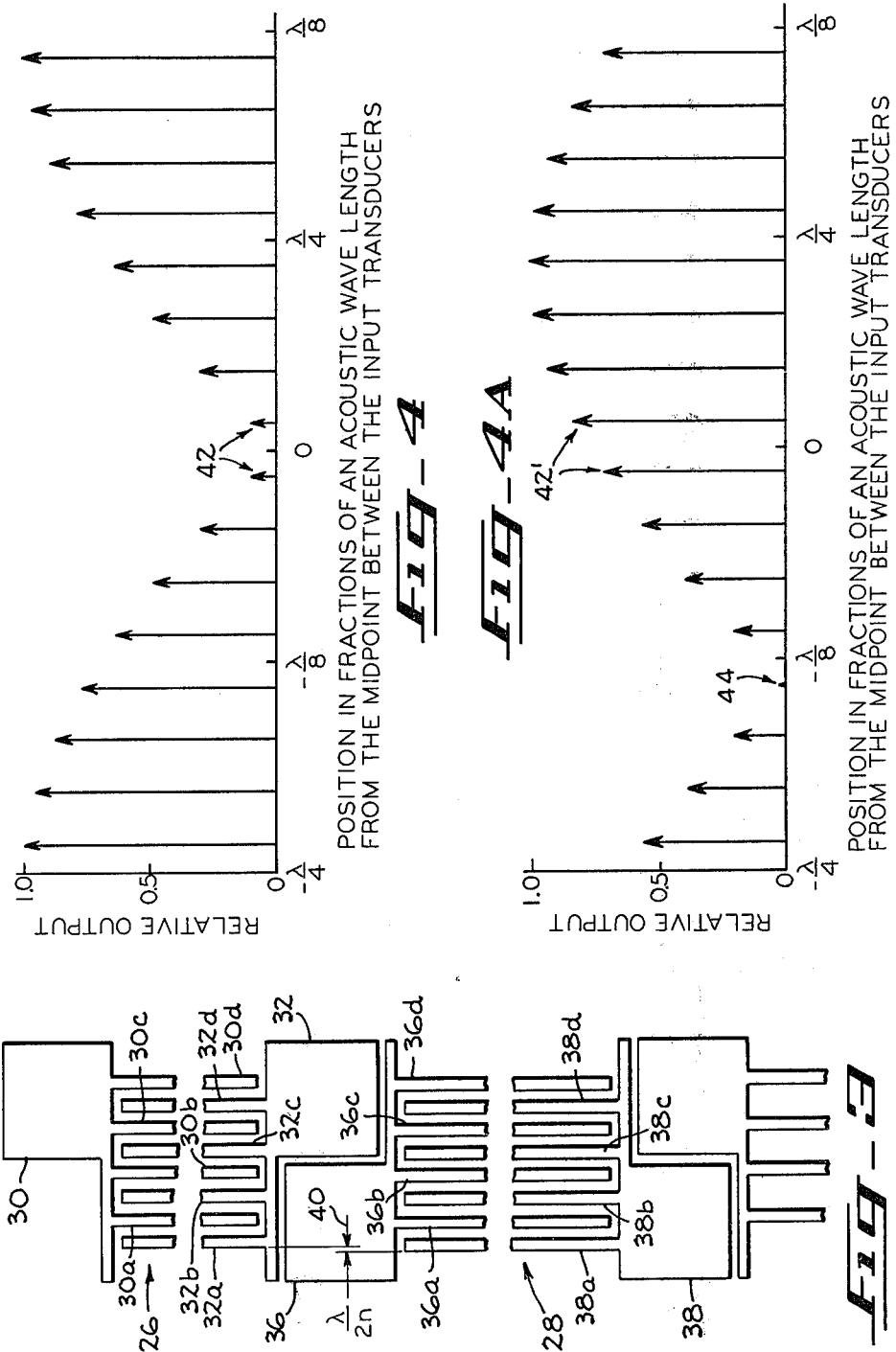

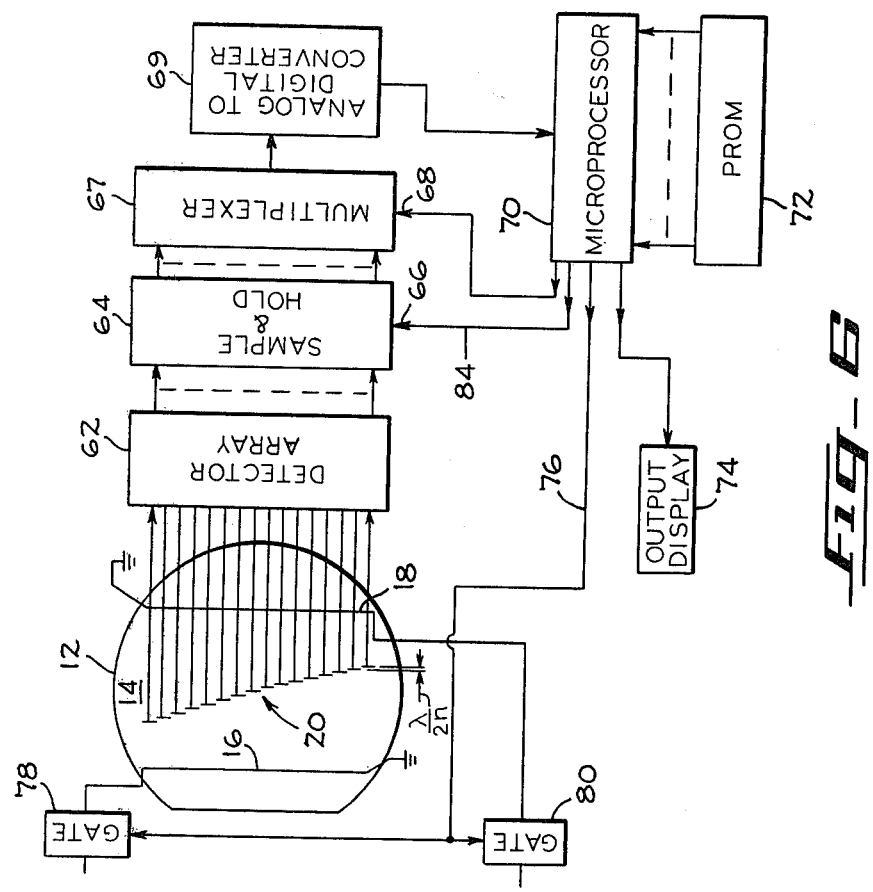
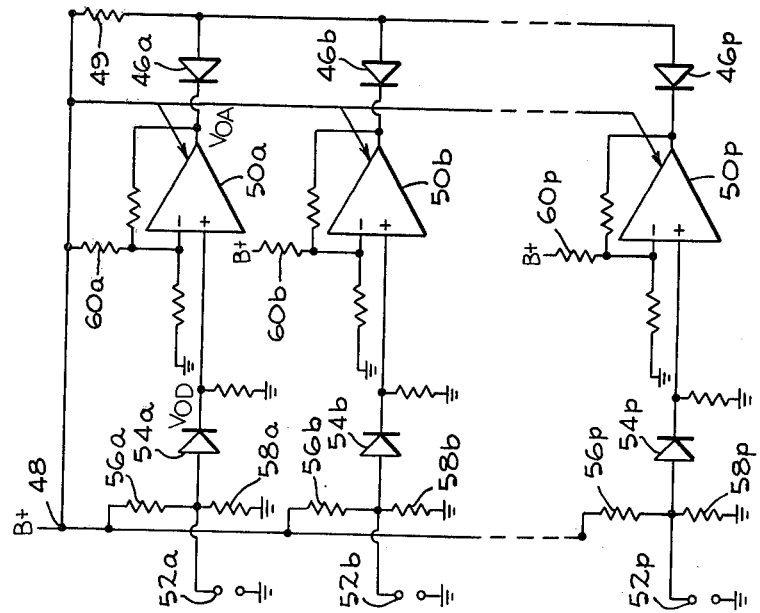

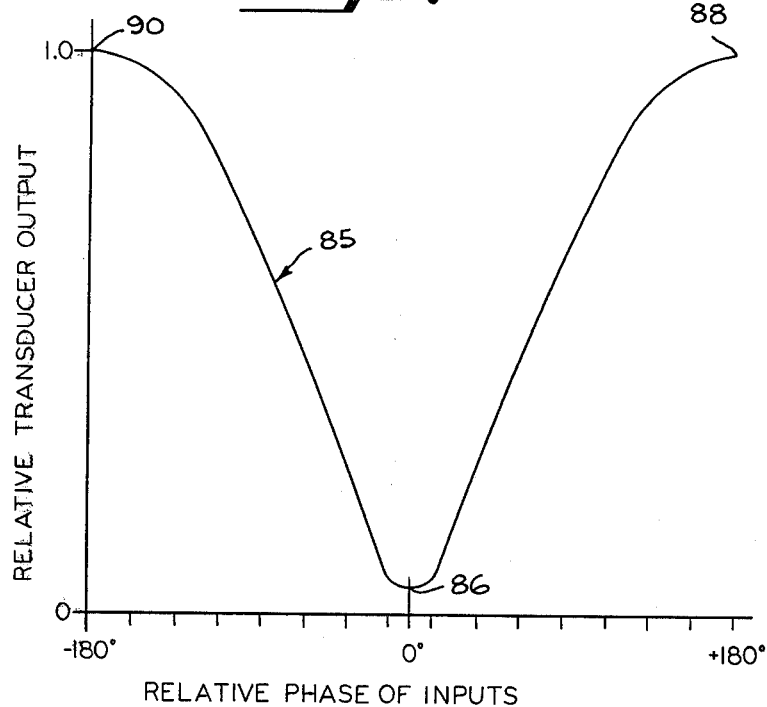
Fig-7
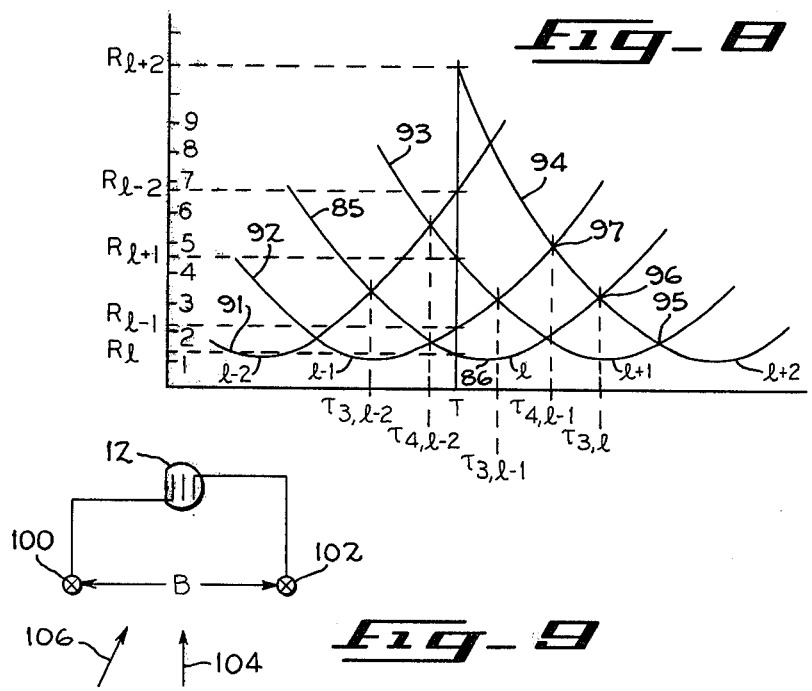
Fig-8
Fig-9

RELATIVE PHASE SENSOR EMPLOYING SURFACE ACOUSTIC WAVES

BACKGROUND OF THE INVENTION

1. Field of the Invention

This invention relates to a sensor for sensing the delay difference or relative phase between two signals of like wave form and more particularly to such device employing surface acoustic waves.

2. Description of the Prior Art

Production of surface acoustic waves in crystalline substrates of lithium niobate and the like and the utilization of such waves has been employed to produce numerous useful devices. Among such devices are filters (U.S. Pat. No. 3,663,899), optical domain shifting devices (U.S. Pat. No. 3,701,122), correlators and convolvers (U.S. Pat. Nos. 3,770,949; 4,037,174; and 4,099,146), delay devices (U.S. Pat. Nos. 3,918,012 and 3,840,826) and transformers between the time and frequency domain (U.S. Pat. Nos. 3,803,395 and 3,925,653).

U.S. Pat. No. 4,016,513 discloses a convolver having two interdigital acoustoelectric transducers disposed on a crystalline surface in spaced apart relation. Between the two input transducers is an output transducer which is oriented obliquely of the input transducers. The signal produced at the output transducer is the convolution of the signals applied to the input transducer.

U.S. Pat. No. 4,024,480 discloses a filter having two closely spaced input transducers formed on a crystalline surface and a plurality of staggered output transducers disposed on a remote portion of the surface. The individual output transducers, which are oriented in an oblique or staggered position, constitute taps on a delay line, the amount of delay occurring at a given output transducer being a function of its physical location with respect to the input transducers.

U.S. Pat. No. 4,114,116 discloses a surface acoustic wave signal processor having two obliquely oriented input transducer arrays and a plurality of output transducers formed on a line normal to the surface acoustic waves produced by the input transducer arrays. Each individual transducer in the input arrays is spaced from the transducers adjacent to it by a multiple of the wave length of the acoustic wave so as to produce at each individual output transducer a unique combination of the signals applied to the two input transducers.

SUMMARY OF THE INVENTION

According to the present invention, two input transducers are formed on the surface of a piezoelectric crystalline body or substrate in parallel spaced apart relation. Two input signals, the delay/phase between which is to be sensed, are applied to the input transducers in such a way that opposite polarity, counter propagating acoustic waves are produced in the body surface. On the surface of the substrate between the input transducers are formed a plurality of output transducers which are spaced from one another by small fractions of a wave length of the surface acoustic wave produced by excitation of the input transducers. An output transducer disposed midway between the input transducers produces minimum output when the signals applied to the input transducers are not delayed relative to one another, because the input signals arrive at such output transducer concurrently and, being of opposite polarity, substantially cancel one another. Cancellation is produced at other output transducers as the relative delay or phase between the two signals applied to the input transducers changes whereby ascertainment of the location of the specific output transducer having the minimum amplitude affords an indication of relative delay or phase between the two input signals.

Further understanding of the present invention can be had by appreciating that the surface acoustic waves have a finite propagation speed on the surface of the piezoelectric material. In other words, the material delays the surface acoustic waves by an amount corresponding to the distance on the surface that the waves travel. If two signals of like wave form but opposite polarity approaching an output transducer from opposite directions are delayed an equal amount, they will substantially cancel one another at the output transducer and the output transducer will have little or no output voltage generated thereacross. If, on the other hand, the surface acoustic wave approaching an output transducer from one direction is delayed with respect to the surface acoustic wave approaching the output transducer from the opposite direction, the two signals on reaching the output transducer will not cancel one another and there will be a substantial voltage produced across the output transducer. Plural output transducers are provided in accordance with the invention and the output transducers are spaced at equal portions of a half wavelength of the surface acoustic wave; a given one of the output transducers will develop minimal output voltage or null at a given relative delay or phase. Consequently, identification of the output transducer having the least output affords an indication of relative delay between the two input signals.

An object of the invention is to provide a sensor for sensing the relative delay between two signals. This object is achieved by providing a plurality of output transducers that are spaced from one another by equal fractions of a half wave length of the surface acoustic wave so that the position of the output transducer having the lowest magnitude output signal thereacross affords an indication of relative phase of the two input signals.

A further object of the invention is to provide a phase or delay difference detector employing the above mentioned sensor which affords a visual indication of the relative delay or phase between two signals. In one embodiment of the invention this object is achieved by providing a device having a plurality of light producing elements, each of which corresponds to one of the output transducers. The device includes circuitry which illuminates the element that is associated with the output transducer having the least voltage thereacross. In another embodiment, the signals at the output transducers are analyzed by an appropriately programmed microcomputer so as to establish which of the output transducers has the least voltage output thereacross.

A feature and advantage of the above mentioned embodiment employing a specially programmed microcomputer is that a delay difference between delay differences that correspond to two adjacent output transducers can be interpolated, thereby affording substantial accuracy with a limited number of output transducers.

A further object of the invention is to provide a method for ascertaining the relative delay difference between two input signals. This object is achieved by providing a piezoelectric body having a surface, inducing surface acoustic waves in the body that correspond to the input signals and sensing at different locations on the surface the location of minimum output or maximum interference between the two surface acoustic waves.

Yet another object of the invention is to provide a device which affords an indication of the direction from which an electromagnetic signal or the like approaches an imaginary line between two spaced apart receiving antennas.

The foregoing, together with other objects, features and advantages will be more apparent after referring to the following specification and the accompanying drawings.

BRIEF DESCRIPTION OF THE DRAWINGS

FIG. 3 is a top view of a portion of FIG. 1 at enlarged scale showing two output transducers.

FIG. 4 is a plot showing the signals at the output transducers when the input signals are in phase.

FIG. 4A is a view similar to FIG. 4 showing the condition of the output transducers when the two input signals are about 101.25° out of phase.

FIG. 5 is a schematic circuit diagram showing one form of output circuitry and display for the sensor of FIG. 1.

FIG. 6 is a block diagram showing a computer utilized as an output processor for the sensor.

FIG. 7 is a plot of output magnitude for an exemplary individual output transducer versus phase or delay difference of the input signals.

FIG. 8 is a plot similar to FIG. 7 showing fragments of the output curves for several adjacent output transducers.

FIG. 9 is a schematic of the transducer and circuit of the invention employed in a system for determining the angle of approach of an RF signal.

DETAIL DESCRIPTION OF THE PREFERRED EMBODIMENTS

Figure 2:
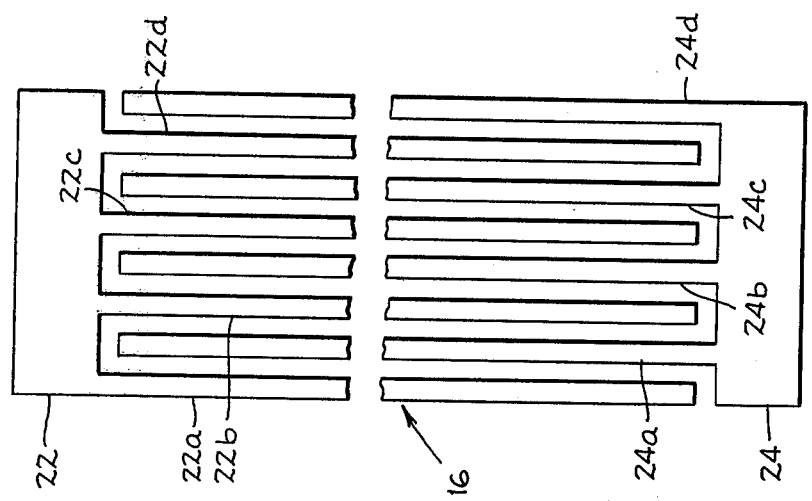
FIG. 2 is a top view of a portion of FIG. 1 at enlarged scale and showing an input transducer in greater detail.
Figure 1:
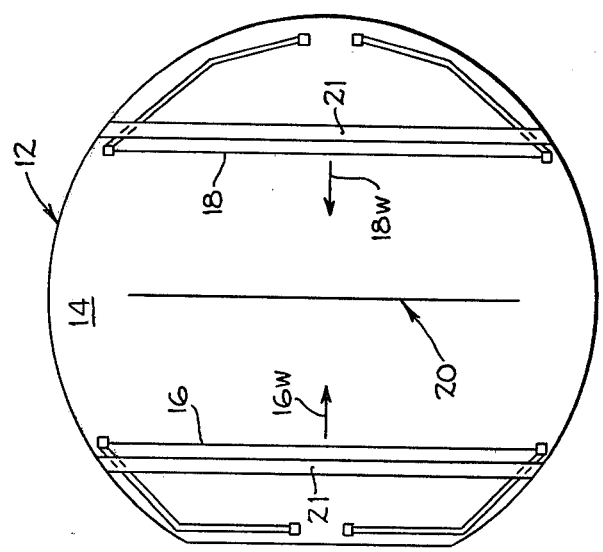
FIG. 1 is a top view of a sensor embodying the invention.

Referring more particularly to the drawings, reference numeral 12 indicates a body of piezoelectric material such as y-cut lithium niobate. Body 12 can have a diameter of about 2 inches, a thickness of about 0.020 inches and a flat chordally extending side which is perpendicular to the Z crystalline direction and is useful for orienting the remainin elements. Body 12 has a flat smooth surface 14 on which is formed a pair of input transducers 16 and 18 and a group 20 of output transducers which are disposed in the space between the input transducers. Extending parallel to input transducers 16 and 18 on the sides thereof remote from output transducer group 20 are damping pads 21 which can be formed of wax, RTV or the like, and function to absorb surface acoustic waves passing thereunder to prevent reflection of such waves back toward the output transducers.

Input transducers 16 and 18 are substantially identical; therefore, the showing in FIG. 2 of input transducer 16 is representative of input transducer 18. As seen in FIG. 2, input transducer 16 includes an upper input terminal or pad 22 and a lower terminal or pad 24. Extending from each of the pads are conductive paths or fingers which are interdigitated. More specifically, from pad 22 fingers 22a, 22b, 22c and 22d extend. From pad 24 fingers 24a, 24b, 24c and 24d extend. The fingers are substantially coextensive in length with input transducer 16. In one sensor designed in accordance with the invention, on a lithium niobate substrate the width of each finger and the space between adjacent fingers is equal to about 10 $\mu$m ($\mu$m = meters $\times 10^{-6}$). In such design the average frequency of the surface acoustic waves is 85 MHz, a frequency compatible with the above noted dimensions. In such design the overall length of the input transducer is about 40 mm. The preceding specifics are exemplary, not limiting.

An RF signal applied across pads 22 and 24 produces surface acoustic waves in surface 14 which waves are propagated in a direction perpendicular to the input transducers into the region between the input transducers, such propagation occurring in the directions indicated by arrows 16W and 18W. The traveling acoustic waves interfere with one another in an active region located near the approximate midpoint between the input transducers. The row 20 of output transducers is located in such active region.

At some point in the active region between input transducers 16 and 18 the surface acoustic waves produced by the input transducers will cancel one another. The precise location of the point of cancellation depends upon relative delay between the signals applied to the input transducers. If, for example, there is no delay between the input signals, the point of cancellation lies precisely midway between the input transducers. If, on the other hand, the signal applied to input transducer 16 is delayed from the signal applied to input transducer 18, the point of cancellation will lie nearer to input transducer 16 than the point midway between the input transducers. Thus a plurality of output transducers is provided, and each output transducer is offset from all others so as to lie at a discrete point in the active region between the input transducers.

FIG. 3 indicates two of a plurality of output transducers, there being an output transducer 26 and an output transducer 28. Each of the output transducers is of substantially identical construction. Referring to output transducer 26, there are connecting pads 30 and 32 from which pads extend conductive fingers which are interleaved or interdigitated. From pad 30 fingers 30a, 30b, 30c and 30d extend. From pad 32 fingers 32a, 32b, 32c and 32d extend in alternating interleaved relationship to fingers 30a–30d.

In a typical sensor embodying the present invention, each individual output transducer is shorter than the input transducers. More particularly, the input transducers have a length L and the output transducers, which are n in number, have a length slightly less than L/n.

Output transducer 28 is of similar construction to output transducer 26 except that the pads 36 and 38 of transducer 28 are transposed from the pads of transducer 26 so that the pads occupy minimal space in a direction perpendicular to the direction of wave propagation from the input transducers (i.e., vertically). Extending downward from pad 36 are conductive fingers 36a, 36b, 36c and 36d. Extending upward from pad 38 are fingers 38a, 38b, 38c and 38d which are interleaved with fingers 36a–36d. A critical relationship between the output transducers is the horizontal offset of the transducers which for the purpose of clarity is exaggerated in FIG. 3 and is indicated at 40. A typical magnitude of offset 40 is $\lambda/2n$, which is about 1.25 $\mu$m in the case of z-propagating acoustic waves on y-cut lithium niobate at 85 MHz ($\lambda$=about 40 $\mu$m) in a system having 16 output transducers (n=16). The offset between output transducers 26 and 28 of $\lambda/2n$ is an example of a general expression of the amount of offset, $P\lambda/2n$, wherein P is relatively prime to n, i.e. wherein P and n have no common fctor other than 1.

Surface acoustic waves from input transducers 16 and 18 approach the output transducers from opposite sides, and waves arriving at a given output transducer at the same time tend to cancel one another whereas waves arriving at different times have less tendency to cancel one another. Accordingly, the position of the output transducer that experiences maximum cancellation is indicative of the relative delay or phase of the two input signals.

If the specific sensor shown in the drawings the output transducers are disposed symmetrically of a point midway between the two input transducers and are equally spread horizontally along a half wavelength. This relationship assures that irrespective of the relative phase or delay difference between the signals applied to the two input transducers, one of the output transducers or an adjacent pair of output transducers will have a minimum signal thereacross indicating maximum cancellation of the two signals applied thereto.

Referring to FIG. 4, there are 16 arrows each of which represents the output signal across one output transducer, the vertical dimension of the arrow representing the magnitude of the signal. Equal minimum signals are represented by arrows 42. Because the output transducers having outputs represented by arrows 42 are symmetrical about a point midway between the two input transducers, equal minimum signals at such transducers indicate that the signals applied to the two input transducers are in phase with one another.

In FIG. 4A the outputs of the output transducers for a condition different from the in-phase condition is shown. It will be noted that the central output transducers have outputs 42' which are not a minimum. Rather, the output of the transducer having the minimum output is indicated at 44 and corresponds to a phase difference between the two input signals of 101.25°.

The offset between the output transducers need not be uniform as in the above described example. In cases in which the delay difference between the input signals is usually at or near some known specific amount, the offset between the output transducers clustered around the site on the active surface corresponding to such specific delay difference can be smaller, whereas the offset between output transducers remote from such site can be larger. Consequently, the magnitude of the delay difference adjacent the known delay difference can be ascertained with more accuracy at the cost of somewhat less accuracy of measurement of delay differences more remote from specific known delay difference. Additionally, it is not essential that all output transducers be confined within a horizontal distance equal to $\lambda/2$, so long as each transducer is disposed at a site representative of a discrete magnitude of delay difference.

The circuit of FIG. 5 provides one satisfactory circuit for permitting identification of the transducer having the lowest output which in turn affords an indication of relative delay or phase between the signals at the input transducers. Because the circuitry associated with each individual output transducer is substantially identical, the circuitry for only three output transducers is shown in FIG. 5. Such circuitry includes for each output transducer, a light source, three of which are indicated at 46a, 46b and 46p. The specific light sources in the circuit of FIG. 5 are light emitting diodes (LED) having their anodes connected to the positive power input terminal 48 through a resistor 49. The negative of the power supply is grounded. The cathodes of the light sources are connected to the outputs of respective operational amplifiers 50a, 50b and 50p, which have output voltages $V_{OA}$. The specific amplifier associated with the output transducer having the lowest voltage thereacross has the smallest output voltage $V_{OA}$ thus causing all the current to flow through the associated light source which in turn provides a visual indication of the phase or delay difference between the input signals applied to input transducers 16 and 18. For so driving the respective operational amplifiers, each output transducer is connected to circuit terminals 52a, 52b and 52p. Such circuit terminals are connected to the respective operational amplifiers through diodes 54a, 54b and 54p, the output of the diodes being indicated at $V_{OD}$. There are voltage dividers formed by respective resistor pairs 56a and 58a, 56b and 58b, and 56p and 58p. The voltage dividers equalize all input signals to the operational amplifiers when no signals are applied to input transducers 16 and 18. Additionally, compensating resistors 60a, 60b and 60p are provided in association with the respective operational amplifiers in order to compensate for the operational amplifier offset voltages and make the output voltages of the respective amplifiers equal when the input voltages are equal.

In operation the circuit of FIG. 5, when no input signals are applied to input transducers 16 and 18, produces at the output of the respective operational amplifiers equal small voltages. Since all LEDs are forward biased and have a small voltage across them, nearly the full power supply voltage exists across resistor 49 and this dtermines the total current to all light sources 46, such current being shared equally among the light sources. The magnitude of the current is such that the light sources glow by an almost imperceptible but uniform amount. When input signals are applied to input transducers 16 and 18, one of the output transducers will have a minimum voltage thereacross for reasons explained previously. Such minimum voltage, applied to the appropriate input terminal 52, causes the associated operational amplifier to have a low voltage output, whereas the other output transducers produce relatively large outputs which in turn cause the associated operational amplifiers to produce large output voltages that reduce or cut off the current through the other light sources. The light source associated with the transducer that has minimum output voltage will therefore take all the current from resistor 49 and will produce substantial light.

The light sources can be arranged in a circular array and/or can have numerical or other indicia associated therewith so as to provide a visual indication of phase difference in degrees or relative delay in units of time between the signals applied to the input transducers.

The operation of the circuit of FIG. 5 will be recapitulated by assuming that the relative phase or delay difference of the signals applied to input transducers 16 and 18 is such that the output transducer having the minimum output thereacross is connected to input terminal 52b. The outputs of the transducers connected to input terminals 52a and 52p will be relatively high and will cause correspondingly high outputs to be produced by the associated operational amplifiers 50a and 50p.

Such high outputs will extinguish light sources 46a and 46p. The relatively small signal applied to input terminal 56b produces a correspondingly low level signal at the output of operational amplifier 50b. A low signal at the output of operational amplifier 50b causes a relatively high voltage across light source 46b, and the consequent current flow therethrough will cause such light source to be illuminated thereby indicating to the user the relative phase or delay difference between the signals applied to input transducers 16 and 18.

In many cases the relative phase or delay difference between the input signals will be such that two adjacent output transducers are excited at low levels. In this case two adjacent light sources 46 will be activated. When the user perceives such situation, he or she can interpolate a relative phase or delay difference between the two corresponding to the illuminated light sources.

The circuit shown in FIG. 6 produces an output which is more accurate than that provided by use of the circuit of FIG. 5 in that the circuit of FIG. 6 provides accurate interpolation of the relative phase or delay difference indication when maximum cancellation of the signals appears at a point on the active surface different from the location of one of the output transducers. Each output transducer in output transducer group 20 is connected to a detector array 62, which has one output conductor for each output transducer; the output conductor contains a voltage having a magnitude proportional to the voltage produced across each output transducer in response to reception thereby of interfering surface acoustic waves from input transducers 16 and 18. Such voltage signals on the outputs of detector array 62 are supplied to and stored in a sample and hold circuit 64. Because the sample and hold circuit is old per se, its details of construction are not described. Suffice to say, the sample and hold circuit has one output conductor corresponding to each of the output transducers on body 12. The voltage signals in sample and hold circuit 64 are retained until a trigger signal is applied to a trigger input 66 on the sample and hold circuit. The outputs of sample and hold circuit 64 are connected to a multiplexer 67 which serializes the readings stored in sample and hold circuit 64 under the control of a control pulse applied to a control terminal 68. The multiplexed readings from multiplexer 67 are coupled to an analog-to-digital converter 69. The converter 69 produces an output reading which is a digitized form of the analog signal produced at the respective output transducers.

The output of analog-to-digital converter 69 is coupled to a microprocessor 70 which is a conventional element and, as will be explained, is programmed to compute the relative phase or delay difference of the signals applied to input transducers 16 and 18 on piezoelectric body 12. Microprocessor 70 uses the signals from analog-to-digital converter 69 and signals from a PROM 72 to produce on an output display 74 an indication of the relative phase or delay difference of the signals supplied to input transducers 16 and 18. The operation of the microcomputer and the contents of PROM 72 will be explained in somewhat more detail hereinbelow. Additionally, the microprocessor produces a gating signal on an output path 76 which controls gates 78 and 80, through which the input signals are applied to input transducers 16 and 18. Gates 78 and 80 supply input signals to the input transducers for a relatively short duration, a duration greater than the time needed for surface acoustic waves to travel from the input transducers to the output transducers in group 20 but less than the time which permits any reflected acoustic signals to influence the signals produced in the output transducers. For example, in one transducer 12 constructed in accordance with the invention the signal produced on path 76 opens gates 78 and 80 for about 3 $\mu$sec, which is sufficient for the output transducers to react to the acoustic waves from the input transducers but insufficient for significant influence on the output transducers by reflected acoustic waves. Microprocessor 70 also produces on a circuit path 82 a clear signal, which is connected to the control terminal of sample and hold circuit 64 so as to clear the circuit prior to receiving additional inputs from detector array 62 and the output transducers in group 20.

Microprocessor 70 selects the transducer in group 20 having the lowest output and can produce on output display 74 an indication of relative phase corresponding with such individual output transducer. It is preferred, however, to program the microprocessor so that it can interpolate phase differences between the discrete phase differences represented by the various output transducers. For example, in the case where there are 16 output transducers in group 20 and the transducers are uniformly offset from one another, selecting the signal transducer having the lowest output produces an accuracy within about $\pm 11.25°$ ($180°/16 = 11.25°$). Far greater accuracy than this can be achieved by measuring the outputs at the two adjacent output transducers having minimum magnitudes and interpolating therebetween.

The response of a single output transducer, which is typical of all other output transducers, is shown in FIG. 7 at 85. When the phase between the input signals is such that there is maximum interference between the surface acoustic waves arriving at the output transducer, the output of the output transducer is a minimum as indicated at 86. When the relative phase is $+180°$ from the minimum, the signal across the output transducer is at a maximum 88 and when the relative phase is $-180°$ from the minimum, the output of the output transducer is at a maximum 90. This phenomenon can also be analyzed in terms of the delay between the two input signals.

A fragment of response curve 85 is shown in FIG. 8 with the response curves of two adjacent output transducers on each side of the transducer having response curve 85. In FIG. 8 are shown response curves 91 and 92 for two transducers offset in one direction from the transducer having response curve 85 and curves 93 and 94 for two transducers offset in the opposite direction from such transducer. The position along the horizontal axis of FIG. 8 of minimum 86 of curve 85 will be assumed in the ensuing description to represent zero delay difference between the signals applied to input transducers 16 and 18. Each of curves 91–94 has a minimum at a different location along the horizontal axis of FIG. 8. The positions of the minima of the respective response curves can be considered first order parameters of the set of curves of FIG. 8. Because each minimum occurs in a portion of the curve that is relatively flat, ascertainment or measurement of the precise location of the minimum is difficult. Accordingly, higher order parameters, points of intersection between the various response curves, are used and give better accuracy. There are second order parameters, an exemplary one of which is indicated at 95, third order parameters, an exemplary one of which is indicated at 96, and fourth order parameters, one of which is indicated at 97. An operable system employing the third and fourth order parameters will be described.

In the following description the output transducer that produces the minimum output signal will be identified as transducer 1. Accordingly in FIG. 8 curve 85 is also identified as 1. Curve 93 is identified as 1+1, curve 94 is identified as 1+2, curve 92 is identified as 1−1 and curve 91 is identified as 1−2. The curve 1 refers to the curve associated with the output transducer that produces the lowest output signal in response to application of input signals to input transducers 16 and 18. Microprocessor 70 is programmed to ascertain which of the output transducers has the lowest output and to identify 1.

In the case of a device having 16 output transducers and 16 curves of the type shown in FIG. 8, there are 16 third order intersection points 96 and 16 fourth order intersection points 97. The relative delay as measured on the abscissa of FIG. 8 of each of the 32 points is stored in PROM 72. For each individual device the stored numbers will be different because of such variables as differences in the smoothness of surface 14, differences in the accuracy with which the output transducers in group 20 are formed, and like manufacturing variables.

In FIG. 8 there are shown three third order points and two fourth order points. Each of the third order points is identified by the reference character $\tau_3$ (the subscript indicating a third order point) and an additional subscript indicating the transducer with which it is associated. Thus there are third order points $\tau_{3,l-2}$; $\tau_{3,l-1}$; and $\tau_{3,l}$. In addition there are fourth order points identified as $\tau_{4,l-2}$ and $\tau_{4,l-1}$.

The foregoing parameters are employed in microprocessor 70 in accordance with the following algorithms:

$$T = \tau_{3,l-1} - (\tau_{3,l-1} - \tau_{4,l-2})\left(\frac{R_{l+1} - R_{l-1}}{R_{l-2} - R_{l-1}}\right), R_{l-1} < R_{l+1}$$

$$T = \tau_{3,l-1} + (\tau_{4,l-1} - \tau_{3,l-1})\left(\frac{R_{l-1} - R_{l+1}}{R_{l+2} - R_{l+1}}\right), R_{l+1} \leq R_{l-1}$$

In the above algorithms, R denotes a reading of the voltage across an output transducer identified by the subscript. Such readings are supplied to microprocessor 70 from analog-to-digital converter 69. The microprocessor also determines the relative magnitude of $R_{l+1}$ and $R_{l-1}$ so as to operate in accordance with the appropriate one of the algorithms.

The operation of the circuit shown in FIG. 6 in performing one of the above noted algorithms will be explained in connection with FIG. 8. It should be assumed that the signals applied to input transducers 16 and 18 are delayed from one another by the time T indicated on the abscissa in FIG. 8. It will be noted that minimum 86 of curve 85 is closest to T so that curve 85 will be identified as curve 1. The readings produced by the output transducers are shown on the ordinate of FIG. 8, such readings being $R_l$, $R_{l-1}$, $R_{l+1}$, $R_{l-2}$, and $R_{l+2}$. Such numbers are supplied to microprocessor 70 from analog-to-digital converter 69. The magnitudes, in nanoseconds of delay, of the third and fourth order points are supplied to the microprocessor from PROM 72. Such readings and points are utilized to compute the value of T which is in the same units as those along the abscissa of FIG. 8. Such solution is displayed on output display 74.

FIG. 9 illustrates in schematic form one practical application of the apparatus of the invention. In FIG. 9 the input transducers on piezoelectric body 12 are connected to respective antennas identified schematically at 100 and 102. Antennas 100 and 102 are disposed on a base line and are spaced from one another by a distance B. In the case of an electromagnetic wave approaching the antennas from a direction perpendicular to the base line, such direction being indicated by an arrow 104, there will be zero delay between the signals induced in antennas 100 and 102 by the wave. Consequently, the centrally located output transducer on piezoelectric body 12 will produce a minimum signal because the surface acoustic waves generated as a result of application of the electromagnetic waves to the input transducers will cancel one another at such centrally located output transducer. If, however, the electromagnetic wave approaches the base line from an oblique direction, such as from a direction indicated by arrow 106, the wave will induce a signal in antenna 100 and the input transducer to which it is connected before the signal reaches antenna 102 and the input transducer to which it is connected. The delay between the two signals as sensed at the output transducers as previously described is indicative of the direction from which wave 106 approaches the base line. It is obvious that in employing the circuitry shown in FIG. 6 in the application of FIG. 9, output display 74 can be calibrated in angular units to provide a direct indication of the angle of approach of the electromagnetic signals impinging on the antennas.

Thus it will be seen that the present invention provides a transducer and circuitry for employment with the transducer that provides an indication of the delay difference between two signals of like wave form that are applied to the transducer. Significant accuracy can be achieved, particularly where a microprocessor is employed to interpolate between two discrete output transducers. Moreover, by using modern fabrication techniques, the transducers can be produced with great accuracy and uniformity. Finally, because the relative phase can be determined from the delay and the frequency of the surface acoustic waves, the invention can be readily adapted to measure and display relative phase between two input signals.

Although several embodiments of the invention have been shown and described, it will be obvious that other adaptations and modifications can be made without departing from the true spirit and scope of the invention.

What is claimed is:

1. A sensor for sensing the delay difference between first and second signals having substantially identical wave forms comprising a piezoelectric body having a surface, first and second interdigital acoustoelectric input transducers disposed on said surface in parallel spaced apart relation to define an active region therebetween, said input transducers being elongated in a first direction and having a length L, means for coupling said signals to respective said input transducers so that surface acoustic waves of a wavelength λ are produced on the action region of said surface, said surface acoustic waves traveling in a second direction normal to said first direction along said surface between said input transducers so as to interfere with one another in said active region, and a row of n output transducers disposed on said surface in said active region substantially midway between said transducers, wherein n is a positive integer greater than one, each said output transducer being an interdigital electroacoustic transducer having a length approximately equal to L/n, said output transducers being arranged in substantially nonoverlapping relation in said first direction and being offset from one another in said second direction by offset distances each bearing a relation to $\lambda/2$ such that the amplitude of the signal produced at each output transducer by interference between surface acoustic waves from said input transducers represents a discrete delay difference between said first and second signals coupled to said input transducers.

2. A sensor according to claim 1 wherein said offset distances are equal to one another and to $P\lambda/2n$, wherein P is relatively prime to n.

3. A sensor according to claim 1 in combination with n circuits coupled to respective said output transducers for detecting the magnitude of the signal thereacross and detecting means coupled to said circuits for identifying the output transducer having the lowest signal thereacross, said detecting means affording indication of the relative phase between said first and second signals.

4. A sensor according to claim 3 wherein n is equal to $2^m$, wherein m is a positive integer, and wherein said detecting means comprises a digital computer.

5. A sensor according to claim 3 wherein each said coupling means comprises an operational amplifier having an input connected to the respective output transducer and an output, each said operational amplifier producing an output voltage level proportional to the magnitude of the signal applied to said input and a plurality of light producing elements connected between respective said outputs and a voltage source so as to illuminate only the light producing element associated with an operational amplifier having a low voltage output.

6. A sensor according to claim 3 wherein each said output transducer has a response curve that substantially continuously varies with variation of the relative delay between said first and second signals applied thereto, the response curves of said output transducers intersecting one another at points of specific relative delay and output magnitude, there being an output transducer $l$, output transducers $l+1$ and $l+2$ offset in one direction therefrom and transducers $l-1$ and $l-2$ offset in the other direction therefrom so as to form parameters $\tau_{3,l-2}$ at the intersection of curves corresponding to transducers $l$ and $l-2$, $\tau_{3,l-1}$ at the intersection of curves corresponding to transducers $l-1$ and $l+1$, $\tau_{3,l}$ at the intersection of curves corresponding to transducers $l$ and $l+2$, $\tau_{4,l-2}$ at the intersection of curves corresponding to transducers $l-2$ and $l+1$, and $\tau_{4,l-1}$ at the intersection of curves corresponding to transducers $l-1$ and $l+2$, means for storing said parameters, detecting means for measuring the outputs of transducers $l$, $l+1$, $l+2$, $l-1$ and $l-2$, microprocessor means coupled to said storing means and said detecting means for computing the delay difference T corresponding to outputs measured by said detecting means in accordance with the following algorithms:

$$T = \tau_{3,l-1} - (\tau_{3,l-1} - \tau_{4,l-2})\left(\frac{R_{l+1} - R_{l-1}}{R_{l-2} - R_{l-1}}\right), R_{l-1} < R_{l+1}$$

$$T = \tau_{3,l-1} + (\tau_{4,l-1} - \tau_{3,l-1})\left(\frac{R_{l-1} - R_{l+1}}{R_{l+2} - R_{l+1}}\right), R_{l+1} < R_{l-1},$$

wherein $R_{l+1}$, $R_{l+2}$, $R_{l-1}$ and $R_{l-2}$ are the outputs of the corresponding output transducers as measured by said detecting means.

7. A method for ascertaining the delay difference between two input signals having substantially the same wave form comprising the steps of providing a piezoelectric body having a surface, inducing surface acoustic waves on the surface that correspond to the respective input signals, directing the surface acoustic waves toward an active region at which the surface acoustic waves interfere with one another, providing on the surface in the active region a plurality of output transducers which are offset from one another by distances that bear a relation to one half the wavelength of the surface acoustic waves, and identifying the output transducer that produces the lowest output voltage.

* * * * *